United States Patent [19]
Toba et al.

[11] Patent Number: 5,574,805
[45] Date of Patent: Nov. 12, 1996

[54] ELECTRIC FIELD SENSOR

[75] Inventors: Yoshikazu Toba; Michikazu Kondo; Yoshiro Sato, all of Sendai; Kazuhisa Hayeiwa, Tokyo; Hisashi Naka, Tokyo; Tadasu Ishikawa, Tokyo, all of Japan

[73] Assignees: Tokin Corporation, Miyagi; Nippon Hoso Kyokai, Tokyo, both of Japan

[21] Appl. No.: 439,468

[22] Filed: May 11, 1995

[30] Foreign Application Priority Data

May 12, 1994 [JP] Japan ................................. 6-098331

[51] Int. Cl.$^6$ ............................................... G02B 6/10
[52] U.S. Cl. ..................................................... 385/3
[58] Field of Search ........................ 385/2, 3, 8, 9, 385/10

[56] References Cited

U.S. PATENT DOCUMENTS

| | | |
|---|---|---|
| 4,395,702 | 7/1983 | Gottlieb et al. .................... 340/347 |
| 5,091,983 | 2/1992 | Lukosz ............................... 385/13 |
| 5,249,243 | 9/1993 | Skeie ................................. 385/3 |
| 5,278,923 | 1/1994 | Nazarathy et al. ................. 385/3 |

*Primary Examiner*—John Ngo
*Attorney, Agent, or Firm*—Frishauf, Holtz, Goodman, Langer & Chick

[57] ABSTRACT

An electric field sensor comprises an electric field sensor head (3) for varying an intensity of a propagating light beam in response to an electric field intensity of an input signal received by a reception antenna (1). The electric field sensor head (3) comprises an incident optical waveguide (9), two phase-shift optical waveguides (10) having a variable refractive index which varies in response to the electric field intensity, an outgoing optical waveguide (11) and, at least one modulation electrode (12) formed in the vicinity of at least one of the two phase-shift optical waveguides (19). The electric field sensor further comprises a circuit element (2) connected between the modulation electrode (12) and the reception antenna (1). The modulation electrode (12) has a thickness not smaller than 1 μm. The modulation electrode (12) may comprise a plurality of split electrodes which are split in a light propagating direction and which are capacitively coupled. The reception antenna (1) is preferably implemented by a low radiation resistance antenna.

7 Claims, 10 Drawing Sheets 5,574,805

1

ELECTRIC FIELD SENSOR

BACKGROUND OF THE INVENTION

This invention relates to an electric field sensor for measuring an electric field intensity of a signal which is an electromagnetic wave propagating through a space.

FIG. 1 is a front view showing a main portion of a conventional electric field sensor. The electric field sensor comprises a reception antenna 101, an electric field sensor head 102, an incident optical fiber 103, an outgoing optical fiber 104, a light source (not shown), and an optical detector (not shown).

The reception antenna 101 is responsive to an input signal. The electric field sensor head 102 is for varying a light intensity of a propagating light beam propagating therethrough in response to an electric field intensity of the input signal received by the reception antenna 101. The incident and the outgoing optical fibers 103 and 104 are connected to the electric field sensor head 102. The light source is connected to one end of the incident optical fiber 103 and is for emitting a light beam to the incident optical fiber 103 as the propagating light beam. The optical detector is supplied with the propagating light beam delivered from the electric field sensor head 102 through the outgoing optical fiber 104 and detects the propagating light beam.

The electric field sensor head 102 comprises a substrate 105, an incident optical waveguide 106, two phase-shift optical waveguides 107, an outgoing optical waveguide 108, and modulation electrodes 109. The incident optical waveguide 106 is formed on the substrate 105 to be connected to the incident optical fiber 103. The phase-shift optical waveguides 107 are formed on the substrate 105 to be branched from the incident optical waveguide 106. The outgoing optical waveguide 108 is formed on the substrate 105 to be connected at one end to the outgoing optical fiber 104 and at the other end to the junction of the two phase-shift optical waveguides 107. The modulation electrodes 109 are formed in the vicinity of the two phase-shift optical waveguides 107, respectively, and are connected to the reception antenna 101.

The above described electric field sensor has a low sensitivity.

SUMMARY OF THE INVENTION

It is therefore an object of this invention to provide an electric field sensor having a high sensitivity.

Other objects of this invention will become clear as the description proceeds.

According to an aspect of this invention, an electric field sensor comprises a reception antenna for receiving an input signal, an electric field sensor head for varying an intensity of a propagating light beam propagating therethrough in response to an electric field intensity of the input signal, an incident optical fiber and an outgoing optical fiber both of which are connected to the electric field sensor head, a light source connected to one end of the incident optical fiber for emitting a light beam to the incident optical fiber as the propagating light beam, and an optical detector supplied with the propagating light beam delivered from the electric field sensor head through the outgoing optical fiber for detecting the propagating light beam. The electric field sensor head comprises a substrate, an incident optical waveguide formed on the substrate to be connected to the incident optical fiber, two phase-shift optical waveguides

2 formed on the substrate to be branched from the incident optical waveguide and having a variable refractive index which varies in response to the electric field intensity, an outgoing optical waveguide formed on the substrate to be connected at one end to the outgoing optical fiber and at the other end to the junction of the two phase-shift optical waveguides, and at least one modulation electrode formed in the vicinity of at least one of the two phase-shift optical waveguides. The electric field sensor further comprises a circuit element connected between the modulation electrode and the reception antenna. The modulation electrode has a thickness not smaller than 1µm. The circuit element, the electric field sensor head and the reception antenna together form a resonance circuit.

According to another aspect of this invention, an electric field sensor comprises a reception antenna for receiving an input signal, an electric field sensor head for varying an intensity of a propagating light beam propagating therethrough in response to an electric field intensity of the input signal, an incident optical fiber and an outgoing optical fiber both of which are connected to the electric field sensor head, a light source connected to one end of the incident optical fiber for emitting a light beam to the incident optical fiber as the propagating light beam, and an optical detector supplied with the propagating light beam delivered from the electric field sensor head through the outgoing optical fiber for detecting the propagating light beam. The electric field sensor head comprises a substrate, an incident optical waveguide formed on the substrate to be connected to the incident optical fiber, two phase-shift optical waveguides formed on the substrate to be branched from the incident optical waveguide and having a variable refractive index which varies in response to the electric field intensity, an outgoing optical waveguide formed on the substrate to be connected at one end to the outgoing optical fiber and at the other end to the junction of the two phase-shift optical waveguides, and at least one modulation electrode formed in the vicinity of at least one of the two phase-shift optical waveguides. The electric field sensor further comprises a circuit element connected between the modulation electrode and the reception antenna. The modulation electrode comprises a plurality of split electrodes which are split in a light propagating direction and which are capacitively coupled. The circuit element, the electric field sensor head and the reception antenna together form a resonance circuit.

DESCRIPTION OF THE PREFERRED EMBODIMENTS

Figure 2:
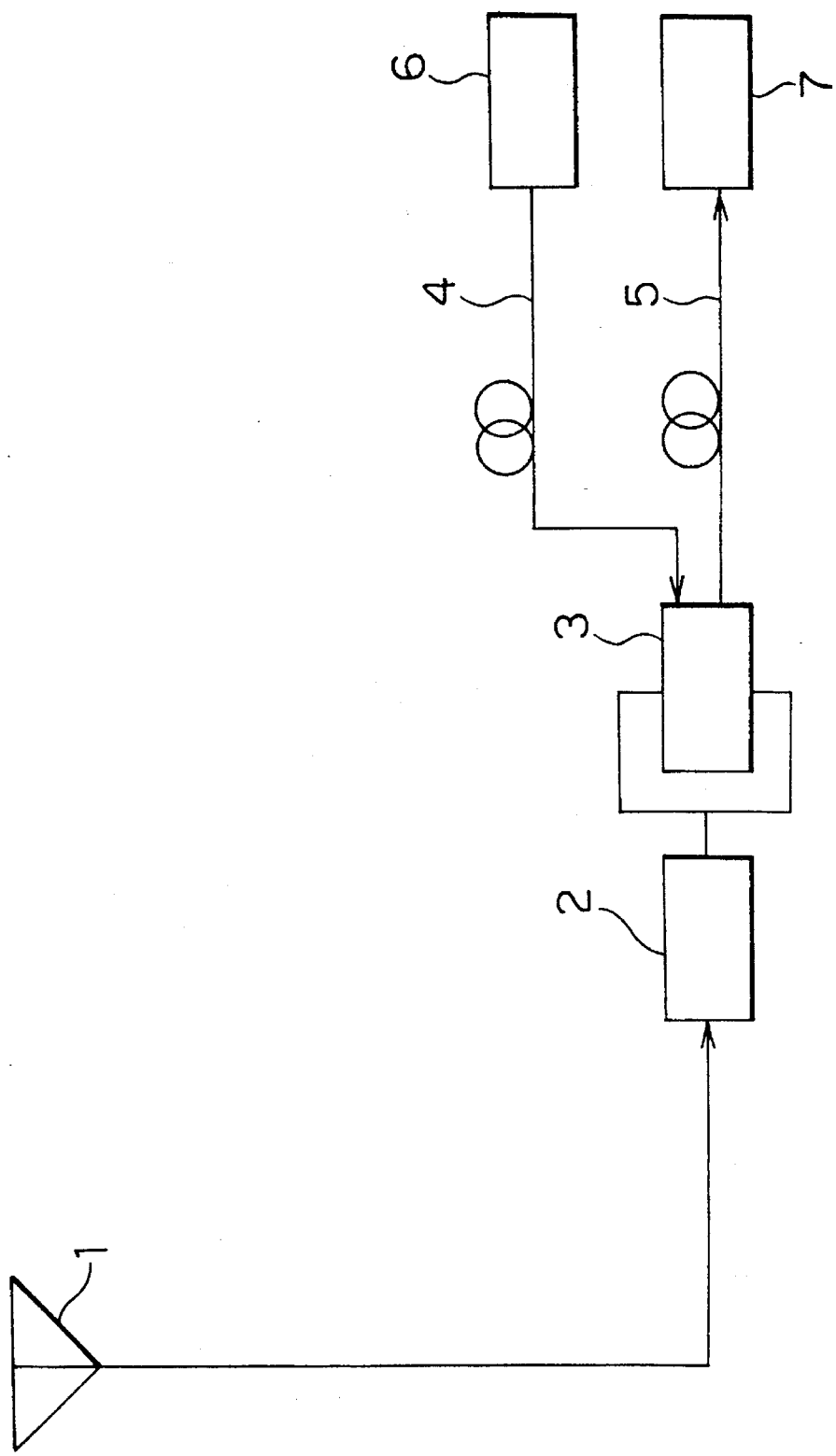
FIG. 2 is a block diagram of an electric field sensor according to an embodiment of this invention.

FIG. 2 is a block diagram of a main portion of an embodiment of this invention. As illustrated in FIG. 2, an electric field sensor according to this invention comprises a reception antenna 1, a circuit element 2, an electric field sensor head 3, an incident optical fiber 4, an outgoing optical fiber 5, a light source 6, and an optical detector 7.

The reception antenna 1 is for receiving an input signal. The electric field sensor head 3 is connected to the reception antenna 1 through the circuit element 2. The electric field sensor head 3 is supplied with the input signal delivered from the reception antenna 1 through the circuit element 2 and varies a light intensity of a propagating light beam in response to an electric field intensity of the input signal. The incident and the outgoing optical fibers 4 and 5 are connected to the electric field sensor head 3. The light source 6 is connected to one end of the incident optical fiber 4 and emits a light beam to the incident optical fiber 4 as the propagating light beam. The optical detector 7 is supplied with the propagating light beam delivered from the electric field sensor head 3 through the outgoing optical fiber 5 and detects the propagating light beam.

Figure 3:
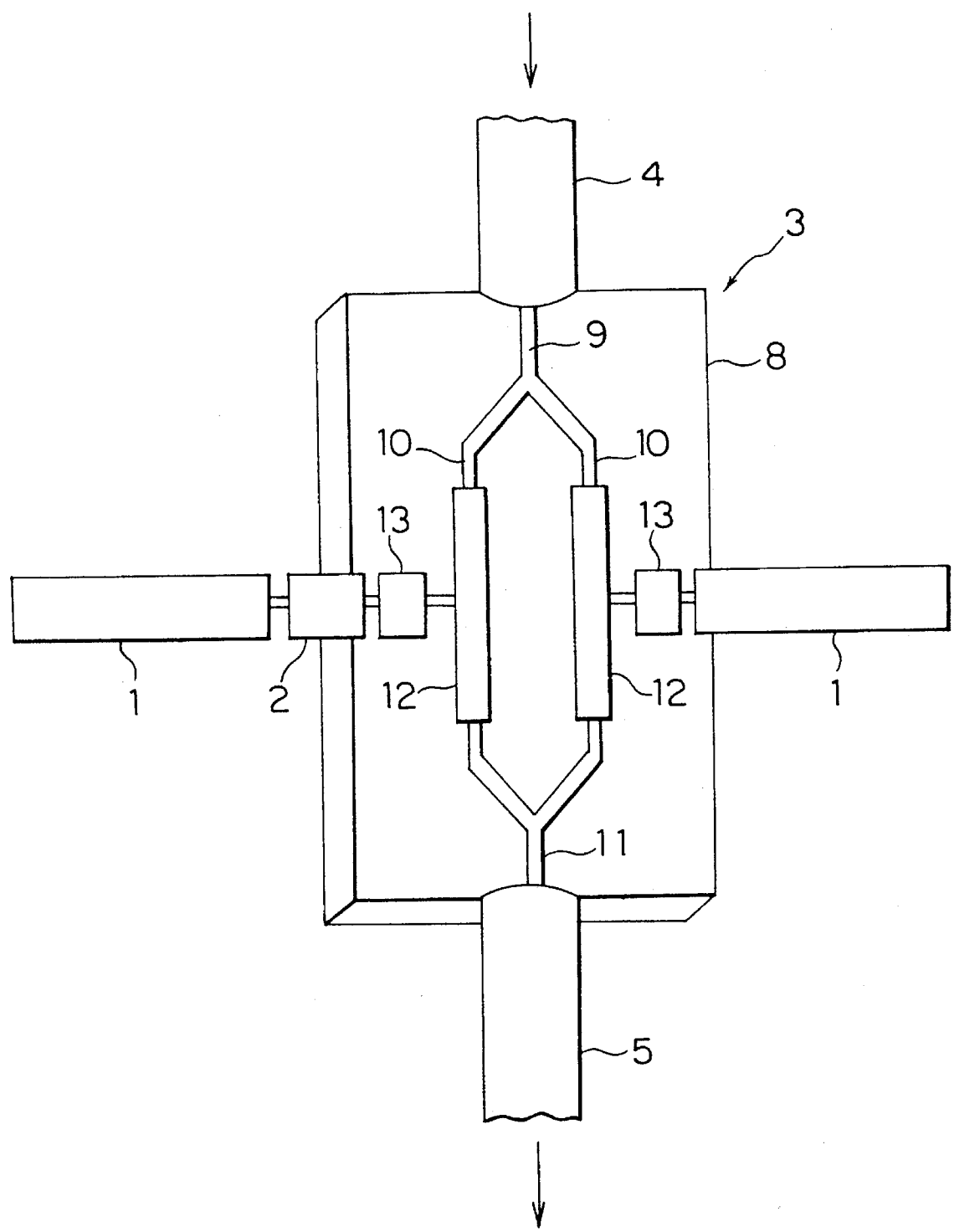
FIG. 3 is a front view of a main portion of the electric field sensor according to the embodiment of this invention.

As illustrated in FIG. 3, the electric field sensor head 3 comprises a substrate 8, an incident optical waveguide 9, two phase-shift optical waveguides 10, an outgoing optical waveguide 11, and modulation electrodes 12. The incident optical waveguide 9 is formed on the substrate 8 to be connected to the incident optical fiber 4. The two phase-shift optical waveguide 10 is formed on the substrate 8 to be branched from the incident optical waveguide 9 and have a variable refractive index which varies in response to the electric field intensity. The outgoing optical waveguide 11 is formed on the substrate 8 to be connected at one end to the outgoing optical fiber 5 and at the other end to the junction of the two phase-shift optical waveguides 10. The modulation electrodes 12 are formed in the vicinity of the two phase-shift optical waveguides 10. The circuit element 2 is connected between one of the modulation electrodes 12 and the reception antennas 1. The reception antenna 1 and the circuit element 2 are connected through electrode pads 13 to the modulation electrodes 12.

The substrate 8 is made of a lithium niobate single crystal plate which is cut out perpendicularly to a c axis. By diffusion of titanium, the incident optical waveguide 9, the phase-shift optical waveguides 10, and the outgoing optical waveguide 11 are formed on the substrate 8. An incident light beam is incident from the incident optical fiber 4 and passes through the incident optical waveguide 9 to be branched to the two phase-shift optical waveguides 10. When the reception antenna 1 receives the input signal, electric voltages are induced and applied to the modulation electrodes 12 to produce, in the two phase-shift optical waveguides 10, electric field components having directions opposite to each other in a depth direction.

As a consequence, variation in refractive index is produced in the two phase-shift optical waveguides 10 due to an electrooptical effect so that a phase difference is produced between light beams propagating through the two phase-shift optical waveguides 10. The phase difference has a level dependent upon the electric field intensity applied to the modulation electrodes 12. The light beams are joined and combined in the outgoing optical waveguide 11 as an outgoing light beam having a light intensity which varies due to an interference therebetween. In other words, the outgoing light beam emitted to the outgoing optical fiber 5 has an intensity which varies in response to the electric field intensity applied to the modulation electrodes 12. Such variation in light intensity is measured by the optical detector 7 to thereby detect the electric field intensity applied to the modulation electrodes 12.

Figure 4:
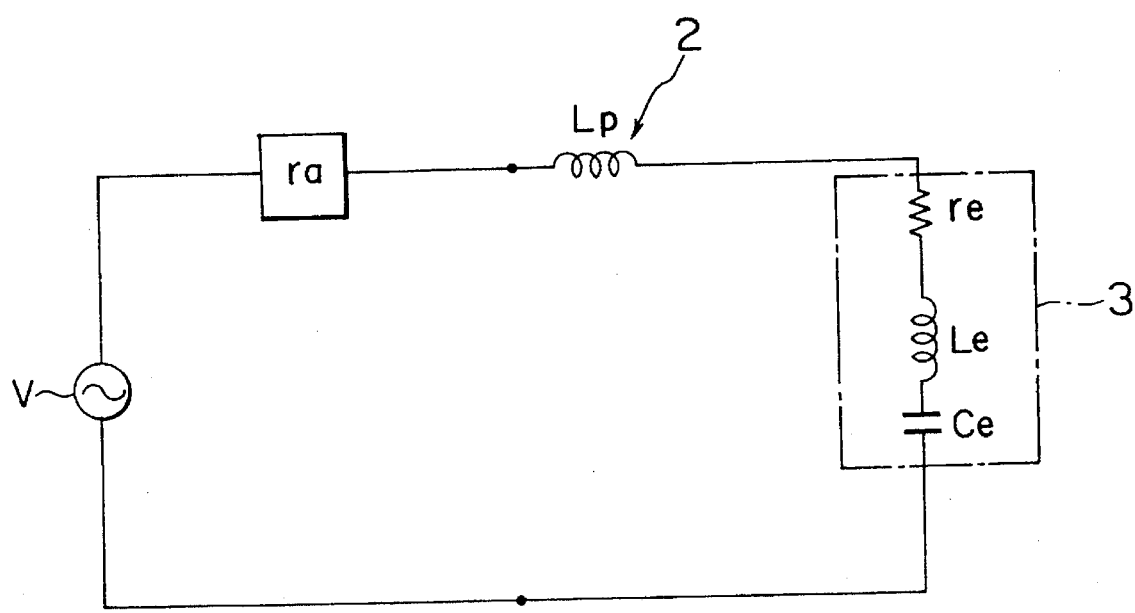
FIG. 4 is a circuit diagram of an equivalent circuit of a resonant device including a reception antenna and an electric field sensor head in the embodiment of this invention.

The modulation electrodes 12 have a thickness not smaller than 1 μm and a low resistance so that a resonator device formed by the electric field sensor head 3, the reception antenna 1, and the circuit element 2 has a Q value not smaller than a predetermined value (for example, 10). FIG. 4 shows an equivalent circuit of the resonator device. In the resonator device, the electric field sensor head 3 has a synthetic resistance re, a synthetic inductance Le, and a synthetic capacitance Ce. The reception antenna 1 has a radiation resistance ra. The input signal has a voltage V. The circuit element 2 comprises a coil having an inductance Lp. Instead, the circuit element 2 may comprise either a condenser or a combination of a condenser and an inductor.

In the electric field sensor according to the embodiment of this invention, the circuit element 2 is connected to one of the modulation electrodes 12 to form the resonator device in order to amplify a voltage applied to the modulation electrode 12. An improved sensitivity is obtained by increasing a Q value (voltage ratio) of the resonator device.

Generally, the Q value of the resonator device is represented by:

$$Q = 1/(2\pi f C R),$$

where f, C, and R represent a frequency, a capacitance component, and a resistance component, respectively.

Figure 5:
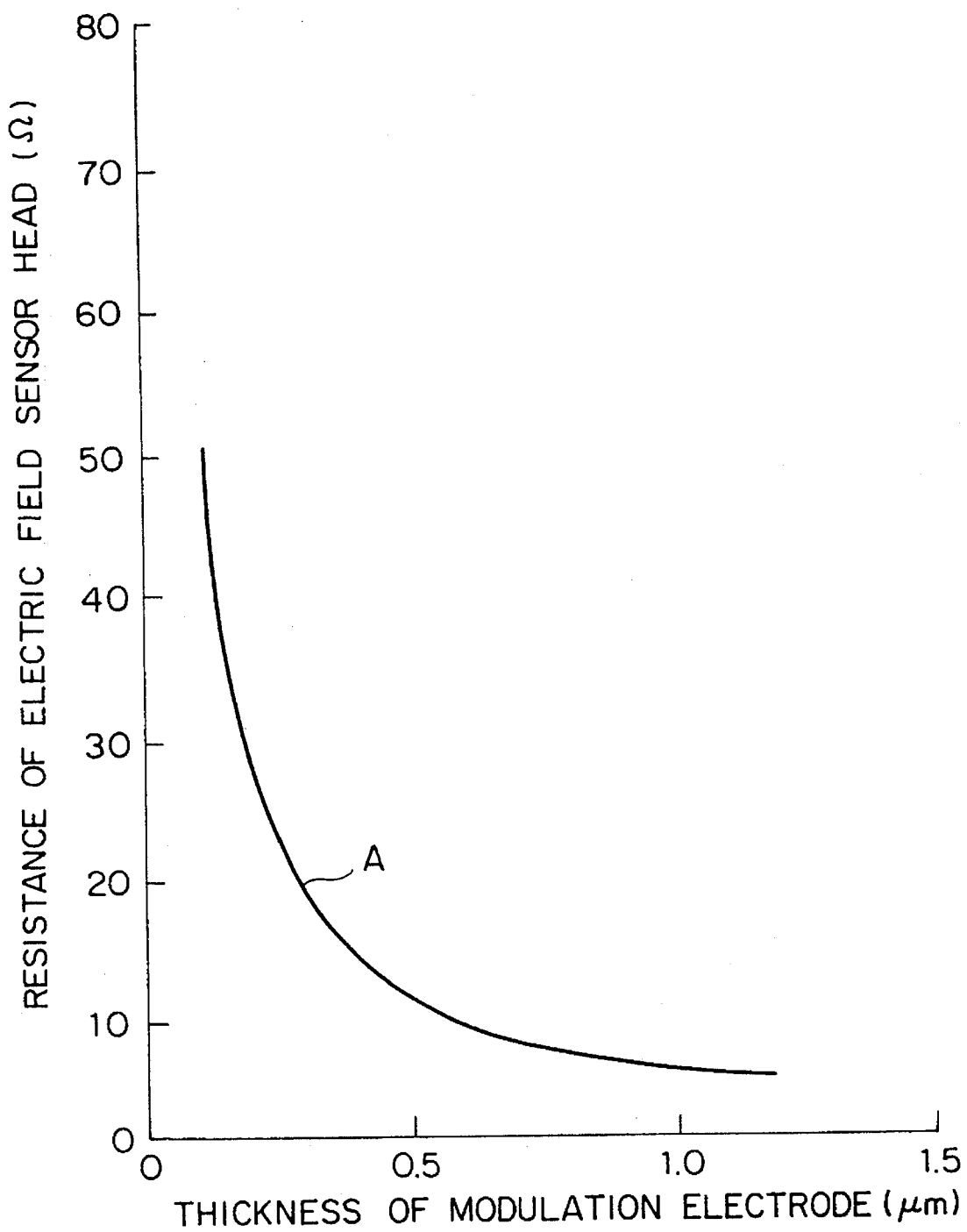
FIG. 5 shows a relationship between a thickness of a modulation electrode and a resistance of the electric field sensor head in the embodiment of this invention.

In order to improve the sensitivity, the modulation electrodes 12 have an increased thickness in the embodiment of this invention to reduce the synthetic resistance of the electric field sensor head 3. The relationship between the thickness of the modulation electrodes 12 and the synthetic resistance of the electric field sensor head 3 is depicted by a curve A illustrated in FIG. 5. In the embodiment of this invention, the modulation electrodes 12 have a thickness not smaller than 1 μm.

Figure 6:
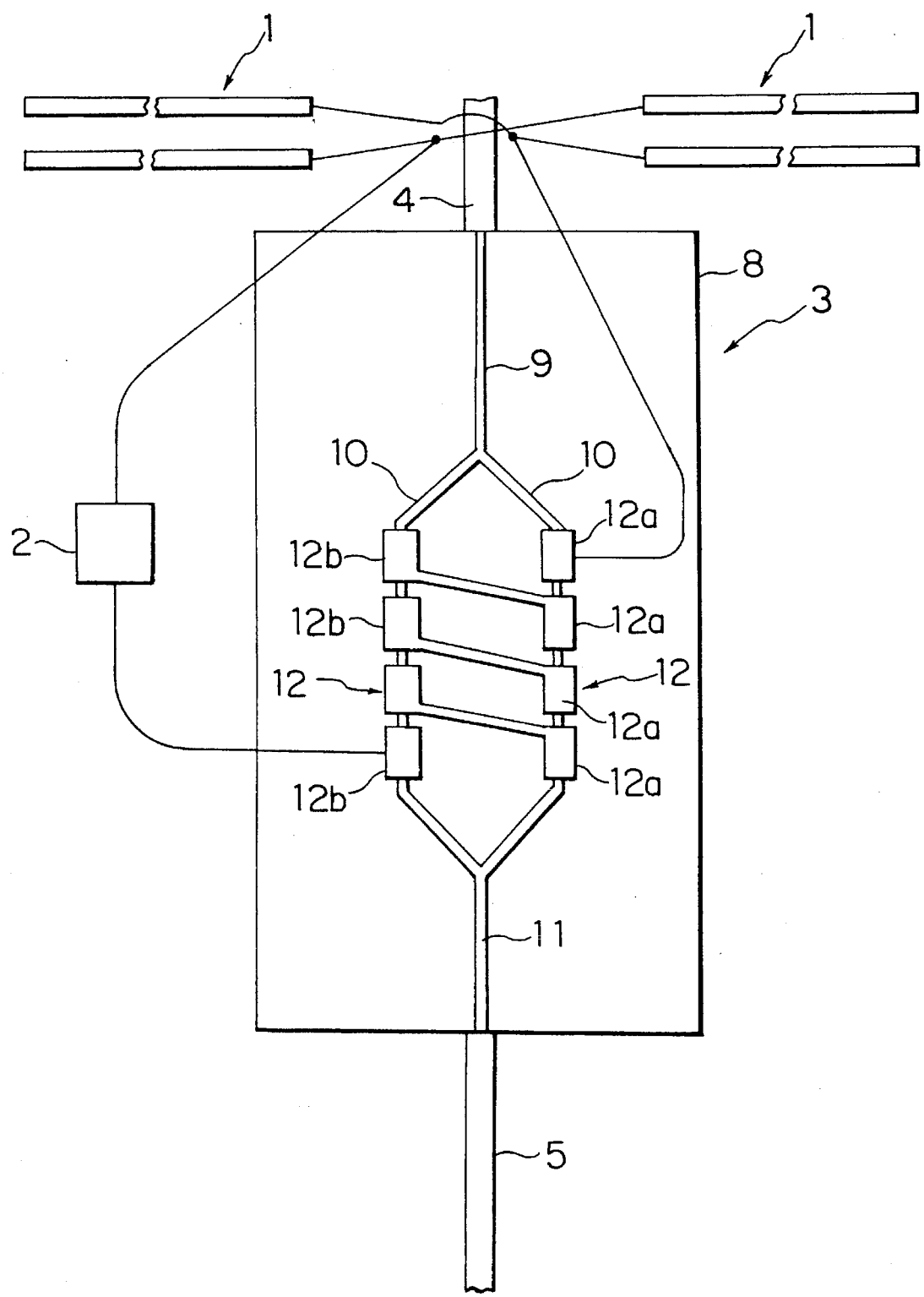
FIG. 6 is a front view of a main portion of an electric field sensor according to another embodiment of this invention.

Next, description will proceed to another embodiment of this invention with reference to FIG. 6.

In this embodiment illustrated in FIG. 6, the modulation electrodes 12 comprise a plurality of split electrodes 12a and 12b split in a light propagating direction and capacitively coupled, respectively. The reception antenna 1 for receiving an electric field is implemented by a low radiation resistance antenna. In this embodiment, the electric field sensor head 3 has a small synthetic capacitance and the reception antenna 1 has a low radiation resistance. Thus, the Q value of the resonator device is increased to thereby improve a sensitivity of the electric field sensor.

As illustrated in FIG. 6, one of the two modulation electrodes 12 comprises the split electrodes 12a, four in number. Likewise, the other of the two modulation electrodes 12 comprises the split electrodes 12b, four in number. One of the split electrodes 12a located at one end of an array of the split electrodes 12a is connected to the reception antenna 1. Likewise, one of the split electrodes 12b located at the other end of an array of the split electrodes 12b is connected to the reception antenna 1 through the circuit element 2. Except those connected to the reception antenna 1, the split electrodes 12a are connected to the split electrodes 12b opposite thereto, respectively.

Figure 7:
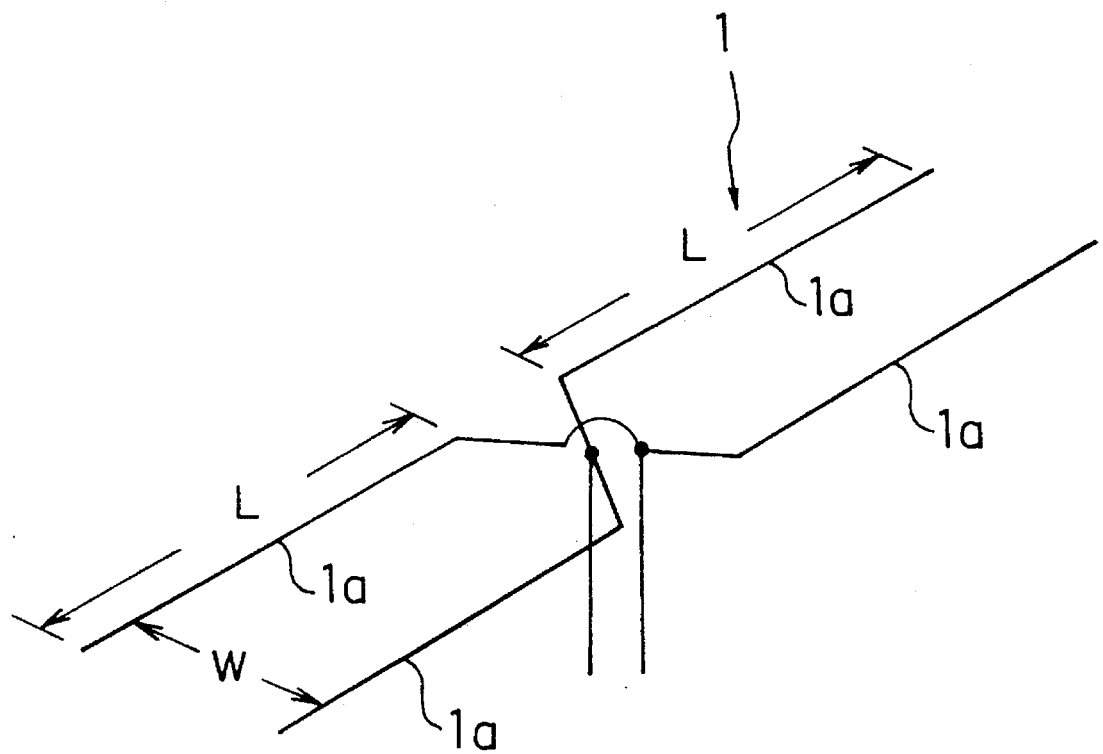
FIG. 7 is a perspective view of a reception antenna in the electric field sensor illustrated in FIG. 6.

The reception antenna 1 comprises a 8JK beam antenna which is one of the low radiation resistance antennas and which is invented by John Claus. The 8JK beam antenna has a basic structure illustrated in FIG. 7. Dipole antenna elements 1a having a length L given by $L = \lambda/2$ ($\lambda$ being the wavelength of a radio wave) are arranged in parallel at an interval w as narrow as about $\lambda/8$. Since the 8JK beam antenna is excited in reverse phase, the radiation resistance is more and more reduced as the interval w between the elements 1a becomes narrower.

The electric field sensor according to this invention may comprise a waveguide or a reflector such as a Yagi antenna. In this event, the sensitivity of the electric field sensor is improved by concentration of the radio wave.

Now, description will be made as regards a specific example of this invention with reference to numerical values.

The substrate 8 was made of a lithium niobate crystal plate (Z-cut plate). After the substrate 8 was entirely coated with a silicon dioxide ($SiO_2$) film as a buffer layer for preventing light absorption, the phase-shift optical waveguides 10 were formed on the substrate 8 in the manner described above. A pair of the modulation electrodes 12 were formed on the phase-shift optical waveguides 10. In this case, the modulation electrodes 12 were made of gold (Au). The electric field sensor head 3 had a synthetic resistance not greater than 5Ω. The modulation electrodes have a thickness of 1μm. Each of the modulation electrodes 12 was split into four split electrodes in the light propagating direction so as to make the electric sensor head 3 have a synthetic capacitance of 3 pF (see FIG. 6).

The resistance and the capacitance of the electric field sensor head 3 were measured by the use of a network analyzer. As a result, the resistance was equal to 5Ω(at a frequency of 500 MHz) and the capacitance was equal to 3 pF. As the reception antenna 1, the 8JK beam antenna was prepared with the elements 1a having an interval w defined by $w = \lambda/10$ and a length L defined by $L = \lambda/2$ (see FIG. 7). The radiation resistance of the 8JK beam antenna was measured by the use of the network analyzer. As a result, the radiation resistance was equal to 5Ω.

The circuit element 2 and the 8JK beam antenna for reception were connected to the modulation electrodes 12 of the electric field sensor head 3 to test the sensitivity in detection of the electric field. As a result, it is found out that the sensitivity is improved in correspondence to the Q value as compared with the conventional electric field sensor. Specifically, the optical detector 7 produced a detection signal of 75 dBμV when the radio wave of 500 MHz applied the electric field intensity of 80 dBμV/m.

Figure 1:
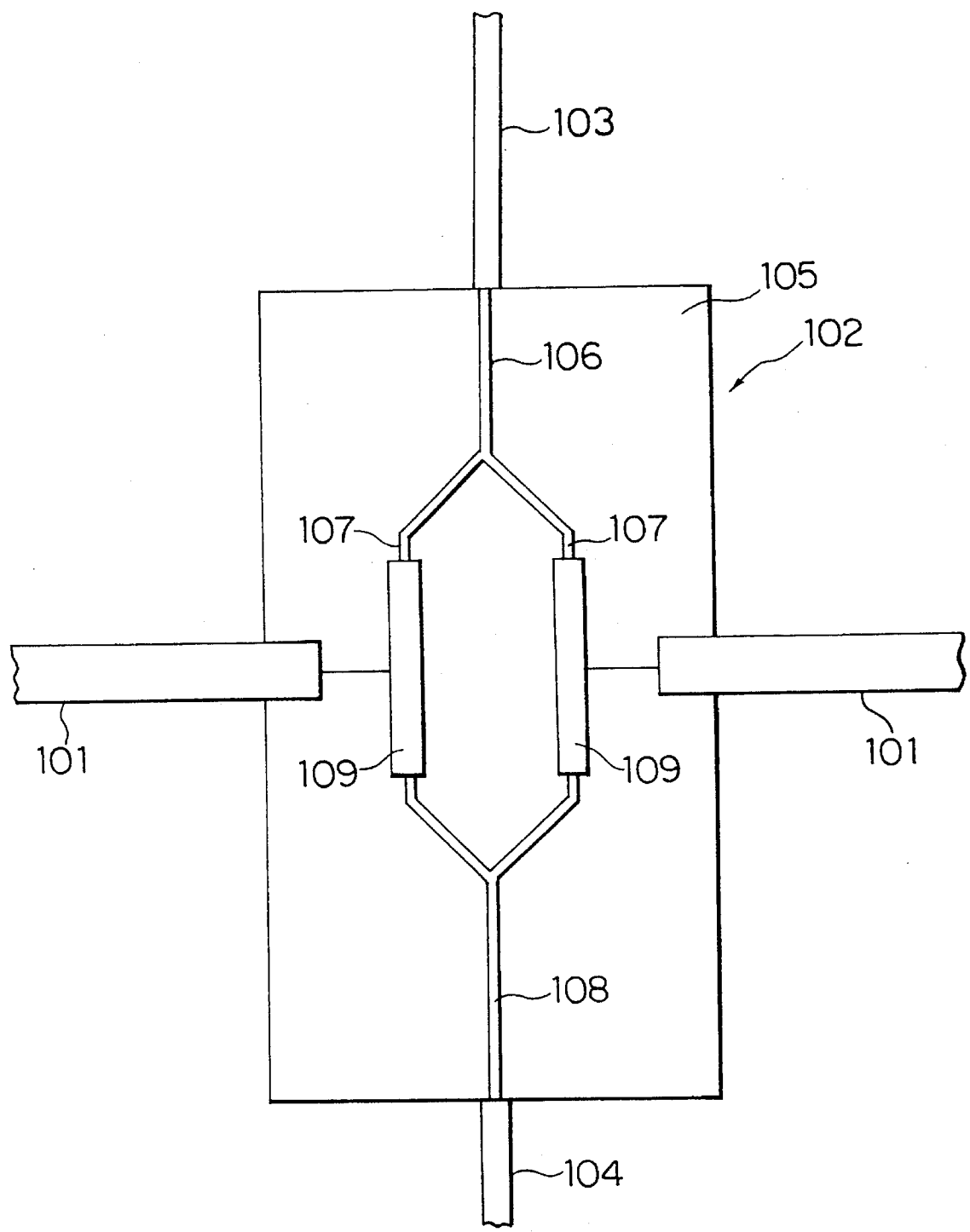
FIG. 1 is a front view of a main portion of a conventional electric field sensor.

For comparison, the conventional electric field sensor (see FIG. 1) was prepared in the following manner to test its sensitivity.

The conventional electric field sensor was made of a similar material by a similar process as the electric field sensor according to this invention, except that an electrode structure comprises a single electrode having a thickness of 1000 angstroms and that the reception antenna is implemented by a half-wave dipole antenna.

The resistance and the capacitance of the conventional electric field sensor head were measured by the use of the network analyzer. As a result, the resistance Was equal to 50Ω(at a frequency of 500 MHz) and the capacitance was equal to 12 pF. The radiation resistance of the half-wave dipole antenna was equal to 73Ω.

Under a similar measurement condition, such as the light source 6 and the optical detector 7, quite similar to the above-mentioned embodiment, the conventional electric field sensor was tested for the sensitivity in detection of the electric field. As a result, the optical detector 7 produced a detection signal of 55 dBμv when the radio wave of 500 MHz applied the electric field intensity of 80 dBμV/m.

As described, the electric field sensor according to this invention has a sensitivity higher by 20 dB than that of the conventional electric field sensor. When the electric field sensor according to the above-mentioned embodiment was combined with the Yagi antenna with a waveguide of 20 elements, the sensitivity was further improved by 10 dB or more. When the film thickness of the modulation electrode 12 was increased to twice or more, the electric field sensor head 3 had a synthetic resistance not greater than 4Ωand a synthetic capacitance on the order of 1.5 pF. In this case, the sensitivity was still further improved by 15 dB as compared with the foregoing.

Next, still another embodiment of this invention will be described.

Figure 8:
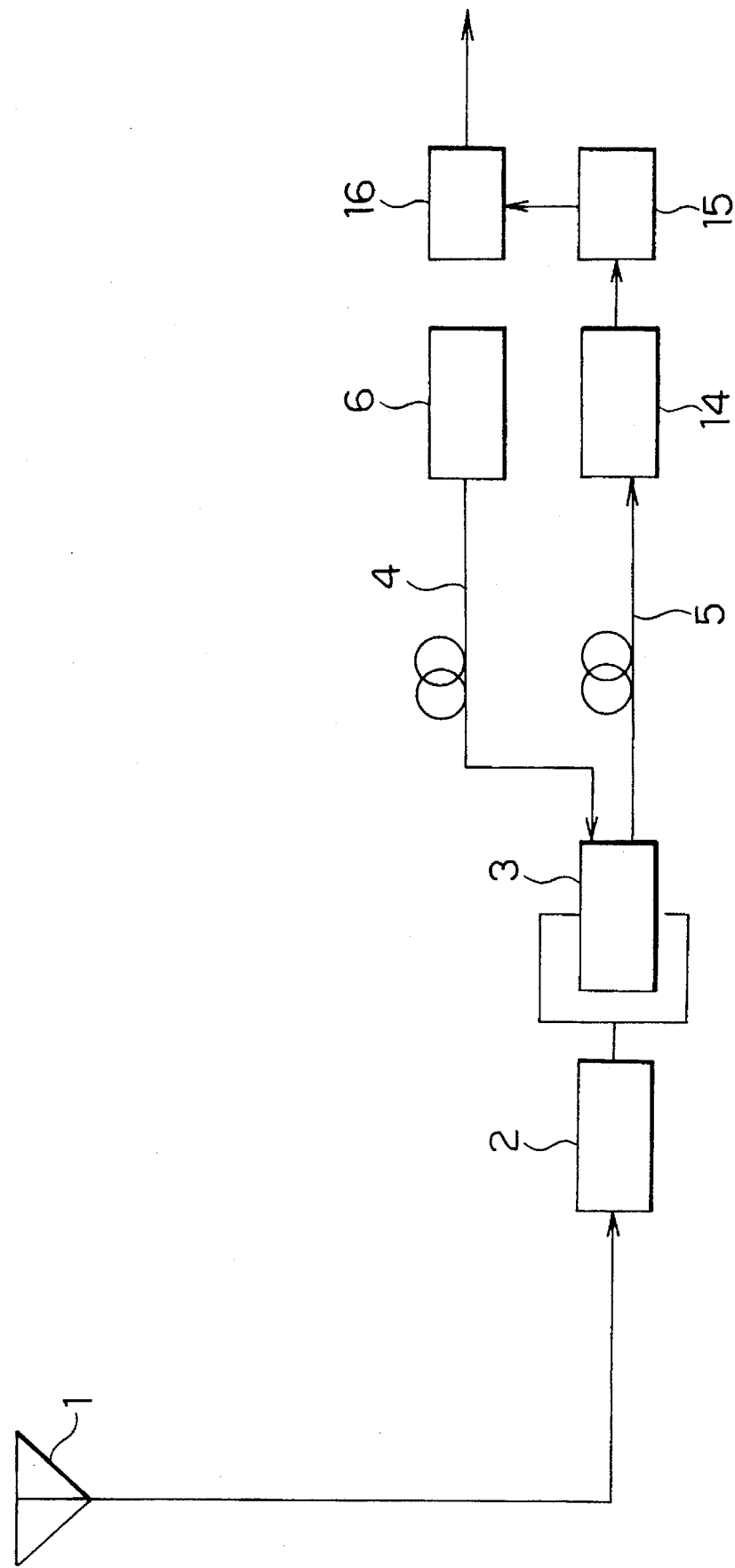
FIG. 8 is a block diagram of an electric field sensor according to still another embodiment of this invention.

FIG. 8 shows an electric field sensor of this embodiment. The electric field sensor head is used in a transmission system of a television relay broadcasting network in which a transmission point and a reception point are separated from each other. The transmission system comprises those components similar to the first-mentioned embodiment illustrated in FIG. 2 and designated by like reference numerals. The transmission system further comprises a photoelectric converter circuit 14 for converting an outgoing light beam from the outgoing optical fiber 5 into an electric signal, a compensator circuit 15 for receiving the electric signal from the photoelectric converter circuit 14, and a conversion amplifier circuit 16 for receiving the electric signal from the compensator circuit 15. The conversion amplifier circuit 16 is responsive to the electric signal delivered from the photoelectric converter circuit 14 through the compensator circuit 15 and converts the electric signal into an IF signal (intermediate frequency signal) to be delivered to the broadcasting network. Thus, an optical signal can be directly modulated by a weak RF signal so that a receiver section requires no battery.

Next, yet another embodiment of this invention will be described.

Figure 9:
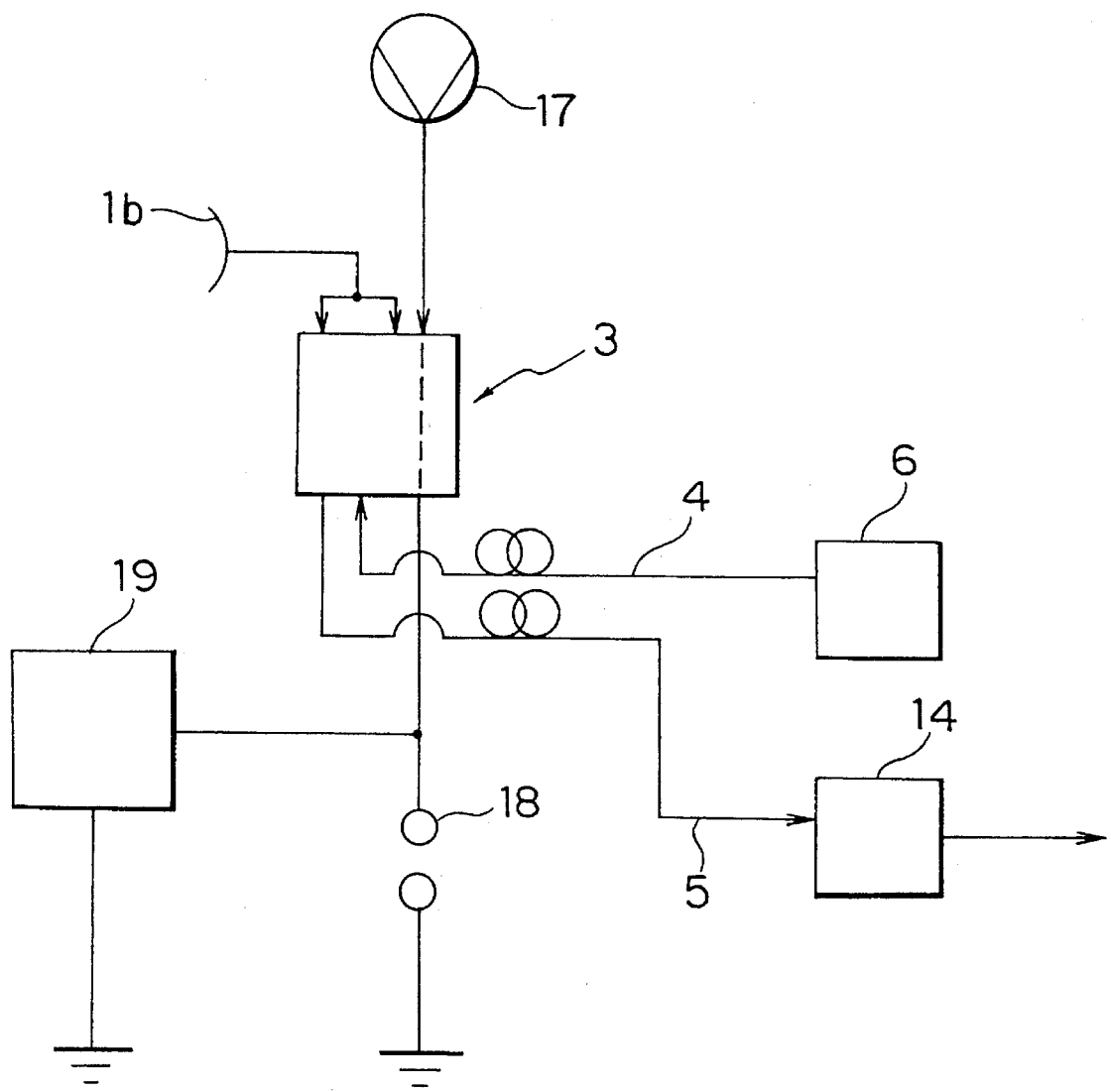
FIG. 9 is a block diagram of an electric field sensor according to yet another embodiment of this invention.

Referring to FIG. 9, an electric field sensor according to this embodiment is used in insulation of an apparatus applied with a high frequency and a high voltage.

For saving a cost, an STL reception parabolic antenna 1b is often attached to a medium-frequency aerial 17 having a length of about 100m, as illustrated in FIG. 9. In this case, the medium-frequency aerial 17 is applied with a high frequency and a high voltage. The electric field sensor head 3 is grounded through a pole gap 18. A medium-frequency transmitter 19 is connected to a connection point between the electric field sensor head 3 and the pole gap 18. By the use of the electric field sensor according to this invention, a common insulator is unnecessary as illustrated in FIG. 9. This makes it possible to reduce the cost.

Next, a further embodiment will be described.

Figure 10:
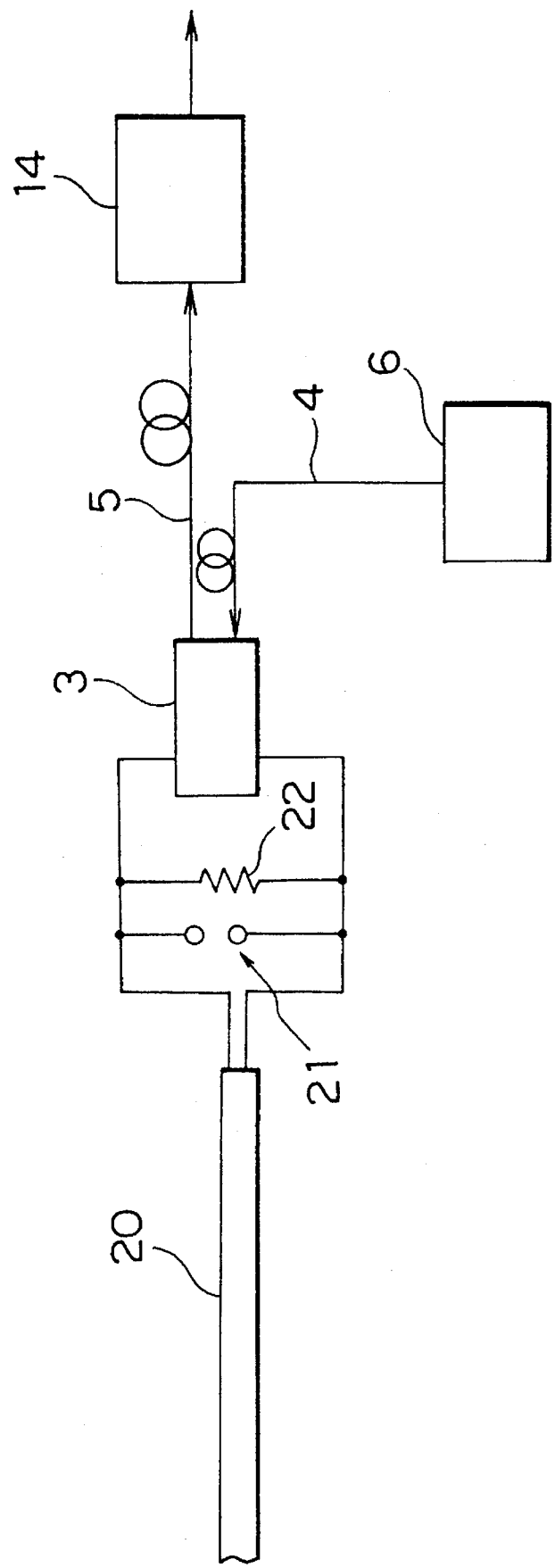
FIG. 10 is a block diagram of an electric field sensor according to a further embodiment of this invention.

FIG. 10 shows an electric field sensor which is used in preventing a wire channel from being damaged by thunderbolt. In this case, the electric field sensor head 3 is connected to an external wire circuit 20 through an arrester 21 and a terminal resistor 22. By the use of the electric field sensor according to this invention, transmission and reception can electrically be isolated so as to prevent destruction of a reception-side apparatus due to thunderbolt or the like.

Although the description has thus far been made in conjunction with the several embodiments, it will be understood that this invention is not restricted thereto and can be modified in various other manners. For example, the electric field sensor head may be provided with a reflector formed at the outgoing side of the phase-shift optical waveguides. The incident light beam passing through the phase-shift optical waveguides is reflected by the reflector and returned back to the incident side to be emitted therefrom. In this structure, a single optical fiber is commonly used as both the incident optical fiber and the outgoing optical fiber.

What is claimed is:

1. An electric field sensor comprising: a reception antenna for receiving an input signal;

an electric field sensor head for varying an intensity of a propagating light beam propagating therethrough in response to an electric field intensity of said input signal;

an incident optical fiber and an outgoing optical fiber, both of said incident and outgoing optical fibers being connected to said electric field sensor head;

a light source connected to one end of said incident optical fiber for emitting a light beam to said incident optical fiber as said propagating light beam;

an optical detector supplied with said propagating light beam delivered from said electric field sensor head through said outgoing optical fiber for detecting said propagating light beam;

said electric field sensor head comprising a substrate, an incident optical waveguide formed on said substrate to be connected to said incident optical fiber, two phase-shift optical waveguides formed on said substrate and branched from said incident optical waveguide and having a variable refractive index which varies in response to said electric field intensity, an outgoing optical waveguide formed on said substrate to be connected at one end thereof to said outgoing optical fiber and connected at the other end thereof to the junction of said two phase-shift optical waveguides, and at least one modulation electrode formed in the vicinity of at least one of said two phase-shift optical waveguides, said at least one modulation electrode having a thickness not smaller than 1 μm; and a circuit element connected between said at least one modulation electrode and said reception antenna, and wherein said circuit element, said electric field sensor head and said reception antenna together form a resonance circuit.

2. An electric field sensor as claimed in claim 1, wherein said at least one modulation electrode comprises a plurality of split electrodes which are split in a light propagating direction and which are capacitively coupled.

3. An electric field sensor as claimed in claim 1, wherein said reception antenna comprises a low radiation resistance antenna.

4. An electric field sensor as claimed in claim 1, wherein at least one of a waveguide and a reflector is coupled to said electric field sensor.

5. An electric field sensor comprising:

a reception antenna for receiving an input signal;

an electric field sensor head for varying an intensity of a propagating light beam propagating therethrough in response to an electric field intensity of said input signal;

an incident optical fiber and an outgoing optical fiber, both of said incident and outgoing optical fibers being connected to said electric field sensor head;

a light source connected to one end of said incident optical fiber for emitting a light beam to said incident optical fiber as said propagating light beam;

an optical detector supplied with said propagating light beam delivered from said electric field sensor head through said outgoing optical fiber for detecting said propagating light beam;

said electric field sensor head comprising a substrate, an incident optical waveguide formed on said substrate to be connected to said incident optical fiber, two phase-shift optical waveguides formed on said substrate and branched from said incident optical waveguide and having a variable refractive index which varies in response to said electric field intensity, an outgoing optical waveguide formed on said substrate to be connected at one end thereof to said outgoing optical fiber and connected at the other end thereof to the junction of said two phase-shift optical waveguides, and at least one modulation electrode formed in the vicinity of at least one of said two phase-shift optical waveguides, said at least one modulation electrode comprising a plurality of split electrodes which are split in a light propagating direction and which are capacitively coupled; and circuit element connected between said at least one modulation electrode and said reception antenna, and wherein said circuit element, said electric field sensor head and said reception antenna together form a resonance circuit.

6. An electric field sensor as claimed in claim 5, wherein said reception antenna comprises a low radiation resistance antenna.

7. An electric field sensor as claimed in claim 5, wherein at least one of a waveguide and a reflector is coupled to said electric field sensor.

* * * * *